(12) United States Patent
Renaudier et al.

(10) Patent No.: US 10,419,149 B2
(45) Date of Patent: Sep. 17, 2019

(54) AMPLIFICATION DEVICE WITH AMPLIFICATION STAGES WITH POLARIZED SOAS AND PROCESSING STAGE, FOR AMPLIFYING OPTICAL SIGNALS IN A WDM TRANSMISSION SYSTEM

(71) Applicants: Jeremie Renaudier, Nozay (FR); Gabriel Charlet, Nozay (FR); Romain Brenot, Nozay (FR)

(72) Inventors: Jeremie Renaudier, Nozay (FR); Gabriel Charlet, Nozay (FR); Romain Brenot, Nozay (FR)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 15/934,122

(22) Filed: Mar. 23, 2018

(65) Prior Publication Data

US 2018/0212702 A1 Jul. 26, 2018

Related U.S. Application Data

(63) Continuation of application No. PCT/EP2016/072773, filed on Sep. 23, 2016.

(30) Foreign Application Priority Data

Sep. 25, 2015 (EM) .................................. 15306493

(51) Int. Cl.
*H04J 14/02* (2006.01)
*H04B 10/291* (2013.01)
(Continued)

(52) U.S. Cl.
CPC ........ *H04J 14/0221* (2013.01); *H01S 5/0683* (2013.01); *H01S 5/4087* (2013.01);
(Continued)

(58) Field of Classification Search
CPC .................. H04J 14/0221; H04B 10/2914
See application file for complete search history.

(56) References Cited

U.S. PATENT DOCUMENTS 4,886,334 A * 12/1989 Aoki ........................ H01S 5/50
359/333
6,078,422 A * 6/2000 Kosaka ................ H01S 3/1301
359/341.3
(Continued)

FOREIGN PATENT DOCUMENTS

EP 0305995 A2 3/1989

OTHER PUBLICATIONS

International Search Report PCT/ISA/210 for International Application No. PCT/EP2016/072773 dated Nov. 28, 2016.

*Primary Examiner* — Nathan M Cors
(74) *Attorney, Agent, or Firm* — Harness, Dickey & Pierce, P.L.C.

(57) ABSTRACT

An amplification device includes an element for splitting an input optical signal into first and second optical signals having first and second polarization modes, first and second amplification stages each including polarized SOAs for amplifying the first and second optical signals depending on driving currents, an intermediate processing stage for compensating optical characteristics of the optical gain bandwidth of the first amplification stage depending on driving currents, an element for combining the first and second optical signals outputted by the second amplification stage to produce an output optical signal, and a control means producing the driving currents depending on information representative of powers of the first and second optical signals before the polarized SOAs of each amplification stage and on a targeted power of the output optical signal.

14 Claims, 2 Drawing Sheets

(51) Int. Cl.
*H04B 10/294* (2013.01)
*H01S 5/0683* (2006.01)
*H01S 5/50* (2006.01)
*H01S 5/40* (2006.01)
*H04J 14/06* (2006.01)

(52) U.S. Cl.
CPC .......... H01S 5/5009 (2013.01); H01S 5/5027 (2013.01); H01S 5/5036 (2013.01); H01S 5/5045 (2013.01); H04B 10/294 (2013.01); H04B 10/2914 (2013.01); H04J 14/06 (2013.01); *H01S 2301/04* (2013.01)

(56) References Cited

U.S. PATENT DOCUMENTS

| | | | | |
|---|---|---|---|---|
| 6,560,010 | B1* | 5/2003 | DiJaili | H01S 5/5072 |
| | | | | 359/337 |
| 2002/0181082 | A1* | 12/2002 | Traynor | H01S 5/5027 |
| | | | | 359/344 |
| 2003/0007246 | A1* | 1/2003 | Zhao | G02B 5/3083 |
| | | | | 359/489.08 |
| 2013/0279910 | A1* | 10/2013 | Ziari | H04J 14/06 |
| | | | | 398/65 |

* cited by examiner

AMPLIFICATION DEVICE WITH AMPLIFICATION STAGES WITH POLARIZED SOAS AND PROCESSING STAGE, FOR AMPLIFYING OPTICAL SIGNALS IN A WDM TRANSMISSION SYSTEM

CROSS-REFERENCE TO RELATED APPLICATIONS

This application is a continuation of PCT International Application No. PCT/EP2016/072773 which has an International filing date of Sep. 23, 2016, which claims priority to European Application No. 15306493.6, filed Sep. 25, 2015, the entire contents of each of which are hereby incorporated by reference.

FIELD OF THE INVENTION

The present invention relates to Wavelength Division Multiplexing (or WDM) transmission systems, and more precisely to amplification devices arranged for amplifying optical signals in such WDM transmission systems.

BACKGROUND

In WDM transmission systems, increasing capacity in an optical fiber link at unchanged amplification bandwidth requires to increase the spectral efficiency.

To get such an increase, it is possible to use complex modulation formats. This allows to go beyond the spectral efficiency of polarization division multiplexed (or PDM) quaternary phase shifted keying (or QPSK) which is the preferred solution in the industry for 100 Gb/s optical transport, but at the expense of strongly reduced transmission distances.

One may also reduce the channel spacing thanks to the use of orthogonal frequency-division multiplexing (or OFDM) or Nyquist pulse shaping techniques. Unfortunately, this solution must be limited to a channel spacing equal to the symbol rate in order to avoid drastic linear crosstalk issue.

But, one may also increase the optical bandwidth. Unfortunately, most of the current WDM transmission systems use erbium doped fiber amplifiers (or EDFAs) whose optical bandwidth appears to be limited to a maximum of 5 THz (~40 nm) since almost fifteen years. Therefore the optical bandwidth of EDFAs is nowadays a limiting factor to the continuous increase of WDM transmission system capacity.

SUMMARY

So an object of this invention is to improve the situation, and notably to allow increasing the optical bandwidth in WDM transmission.

In an embodiment, an amplification device comprises:
a first splitting element arranged for splitting an input optical signal in first and second optical signals having respectively first and second polarization modes,
first and second amplification stages each comprising first and second polarized semiconductor optical amplifiers (or SOAs) arranged for amplifying respectively the first and second optical signals as a function of driving currents,
an intermediate processing stage inserted between the first and second amplification stages and arranged for compensating chosen optical characteristics of an optical gain bandwidth of the first amplification stage as a function of other driving currents,
a first combination element arranged for combining the first and second amplified optical signals outputted by the second amplification stage to produce an output optical signal, and
a control means arranged for producing the driving currents as a function of information representative of powers of the first and second optical signals at least before the first and second polarized SOAs of each amplification stage and of a targeted power of the output optical signal.

The amplification device may include additional characteristics considered separately or combined, and notably:
the first and second polarized SOAs of each amplification stage may be arranged for amplifying optical signals having the first polarization mode. In this case, it may further comprise a first transformation element arranged for transforming the second polarization mode of the second optical signal in the first polarization mode before the second polarized SOA of the first amplification stage, and a second transformation element arranged for transforming the first polarization mode of the first optical signal in the second polarization mode after the first polarized SOA of the second amplification stage, so that the first combination element combines the first optical signal amplified, having the second polarization mode and outputted by the second amplification stage with the second optical signal amplified, having the first polarization mode and outputted by the second amplification stage to produce the output optical signal;
the first transformation element and/or the second transformation element may comprise a waveplate;
it may further comprise first and second micro-lenses located respectively just before and just after the first polarized SOA of each amplification stage, and third and fourth micro-lenses located respectively just before and just after the second polarized SOA of each amplification stage;
its intermediate processing stage may comprise a) a first variable optical attenuator arranged for compensating, on the first optical signal, a tilt of the optical gain bandwidth of the first polarized SOA of the first amplification stage, b) a first gain flattening filter arranged for compensating, on the first optical signal, ripples of the optical gain bandwidth of the first polarized SOA of the first amplification stage, c) a second variable optical attenuator arranged for compensating, on the second optical signal, a tilt of the optical gain bandwidth of the second polarized SOA of the first amplification stage, and d) a second gain flattening filter arranged for compensating, on the second optical signal, ripples of the optical gain bandwidth of the second polarized SOA of the first amplification stage;
in a variant of embodiment, its intermediate processing stage may comprise a) a second combination element arranged for combining the first and second amplified optical signals outputted by the first amplification stage to produce an intermediate optical signal, b) a variable optical attenuator arranged for compensating, on this intermediate optical signal, a tilt of the optical gain bandwidth of the first stage, c) a gain flattening filter arranged for compensating, on this intermediate optical signal, ripples of the first amplification stage, and d) a second splitting element arranged for splitting the intermediate optical signal, processed by the variable optical attenuator and gain flattening filter, in first and second optical signals having respectively the first and second polarization modes;

its intermediate processing stage may further comprise a third transformation element arranged for transforming the first polarization mode of the first optical signal in the second polarization mode before the second combination element, and a fourth transformation element arranged for transforming the second polarization mode of the second optical signal in the first polarization mode after the second splitting element;

the third transformation element and/or the fourth transformation element may comprise a waveplate;

it may further comprise, just before each amplification stage, a) a first extracting element arranged for taking a first predefined percentage of the power of the first optical signal before the first polarized SOA, b) a first photodiode arranged for producing a first information representative of the power taken from the first optical signal before the first polarized SOA for the control means, c) a second extracting element arranged for taking a second predefined percentage of the power of the second optical signal before the second polarized SOA, and d) a second photodiode arranged for producing a second information representative of the power taken from the second optical signal before the second polarized SOA for the control means;

its control means may be arranged for producing the driving currents as a function of information representative of powers of the first and second optical signals before and after the first and second polarized SOAs of each amplification stage and of the targeted power of the output optical signal;

it may further comprise, after each amplification stage, a) a third extracting element arranged for taking a third predefined percentage of the power of the first optical signal after the first polarized SOA, b) a third photodiode arranged for producing a third information representative of the power taken from the first optical signal after the first polarized SOA for the control means, c) a fourth extracting element arranged for taking a fourth predefined percentage of the power of the second optical signal after the second polarized SOA, and d) a fourth photodiode arranged for producing a fourth information representative of the power taken from the second optical signal after the second polarized SOA for the control means;

the first polarization mode may be a transverse electric (or TE) mode and the second polarization mode may be a transverse magnetic (or TM) mode;

each splitting element and/or each combination element may comprise a birefringent material;

its control means may be arranged for determining the driving currents from stored data establishing a correspondence between information representative of powers and driving currents;

it may further comprise a polarization dependent optical isolator before each input and/or after each output of each amplification stage.

BRIEF DESCRIPTION OF THE FIGURES

Some embodiments of an amplification device in accordance with embodiments of the present invention are now described, by way of example only, and with reference to the accompanying drawings, in which.

DESCRIPTION OF EMBODIMENTS

Hereafter is notably disclosed an amplification device 1 intended for amplifying input optical signals in a Wavelength Division Multiplexing (or WDM) transmission system.

Figure 1:
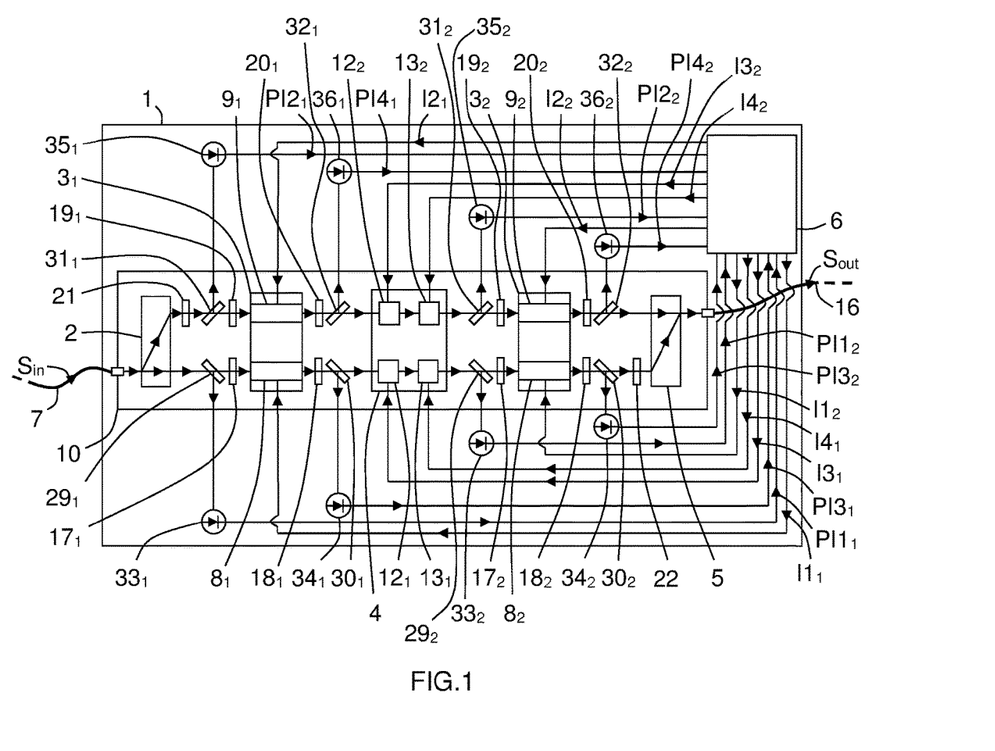
FIG. 1 schematically and functionally illustrates a first example of embodiment of an amplification device according to the invention.
Figure 3:
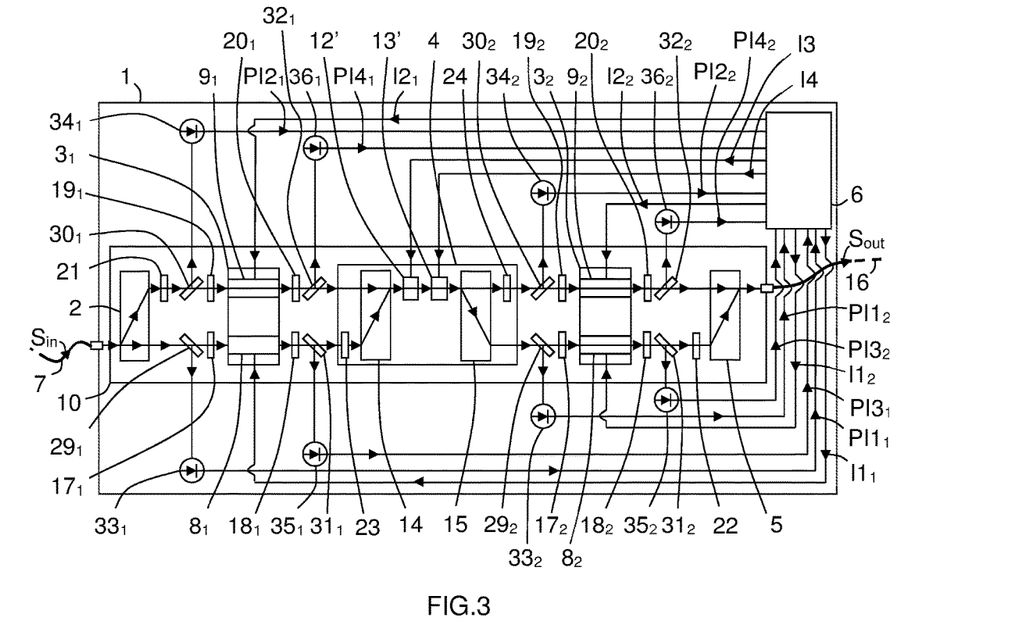
FIG. 3 schematically and functionally illustrates a second example of embodiment of an amplification device according to the invention.

As illustrated in FIGS. 1 and 3, an amplification device 1 according to the invention comprises at least a first splitting element 2, first $3_1$ and second $3_2$ amplification stages, an intermediate processing stage 4, a first combination element 6, and a control means 6.

The first splitting element 2 is arranged (or configured) for splitting an input optical signal $S_{in}$ in first and second optical signals having respectively first and second polarization modes. As illustrated, this input optical signal $S_{in}$ is provided by a first optical fiber link 7 of a WDM transmission system, which is connected to an input of the amplification device 1.

For instance, the first splitting element 2 may be a polarization beam splitter which may be realized by using a birefringent material that is capable of physically splitting the input optical signal $S_{in}$ in first and second optical signals in order to deliver them respectively onto distant first and second outputs. For instance, the birefringent material may be a crystal quartz.

Also for instance, the first polarization mode may be a transverse electric (or TE) mode and the second polarization mode may be a transverse magnetic (or TM) mode. But the reverse situation may be envisaged (i.e. a first polarization mode that is a TM mode and a second polarization mode that is a TE mode) if the amplifier is designed and/or positioned to amplify TM mode.

Each amplification stage $3_i$ (i=1 or 2) comprises first $8_i$ and second $9_i$ polarized semiconductor optical amplifiers (or SOAs) arranged for amplifying respectively the first and second optical signals as a function of driving currents.

More precisely, the first polarized semiconductor optical amplifier (or SOA) $8_1$ of the first amplification stage $3_1$ (i=1) is arranged for amplifying the first optical signal (originating from a first output of the first splitting element 2) as a function of a driving current $I1_1$ provided by the control means 6.

The second polarized semiconductor optical amplifier (or SOA) $9_1$ of the first amplification stage $3_1$ (i=1) is arranged for amplifying the second optical signal (originating from a second output of the first splitting element 2) as a function of a driving current $I2_1$ provided by the control means 6.

The first polarized semiconductor optical amplifier (or SOA) $8_2$ of the second amplification stage $3_2$ (i=2) is arranged for amplifying the first optical signal (originating from a first output of the intermediate processing stage 4) as a function of a driving current $I1_2$ provided by the control means 6.

The second polarized semiconductor optical amplifier (or SOA) $9_2$ of the second amplification stage $3_2$ (i=2) is arranged for amplifying the second optical signal (originating from a second output of the intermediate processing stage 4) as a function of a driving current I2$_2$ provided by the control means 6.

One means here by "polarized SOA" a SOA arranged for optimally amplifying an optical signal having a predefined polarization mode. This type of SOA, optimized for a predefined polarization mode, may be designed to exhibit a very large gain bandwidth.

Figure 2:
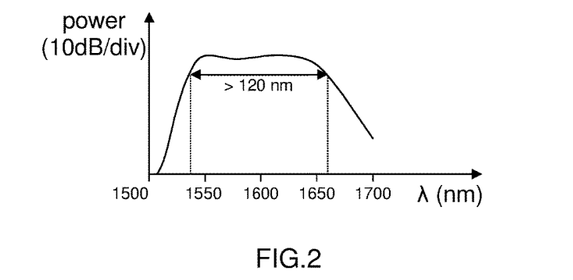
FIG. 2 schematically illustrates in a diagram an example of evolution of the optical power outputted by a polarized SOA as a function of the wavelength in nanometer (nm)

The diagram of FIG. 2 illustrates an example of evolution of the optical power outputted by a polarized SOA with a very large gain bandwidth as a function of the wavelength in nanometer (nm). In this example the gain bandwidth is larger than 120 nm, which represents a threefold increase of optical gain bandwidth with respect to commonly used EDFAs.

For instance, and as illustrated in the non-limiting examples of FIGS. 1 and 3, each amplification stage 3$_i$ may be an integrated component that is secured to a small plate (or board) 10 and in two sub-parts of which are respectively defined a first SOA 8$_i$ and a second SOA 9$_i$.

Figure 4:
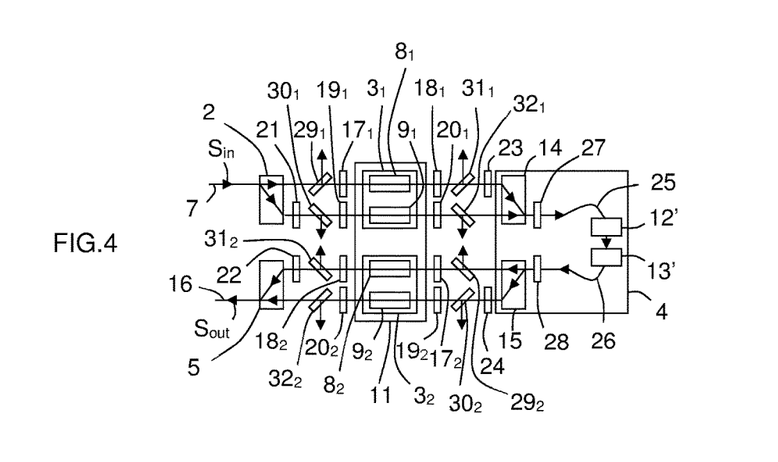
FIG. 4 schematically and functionally illustrates a part of a third example of embodiment of an amplification device according to the invention.

But in a variant illustrated not limitatively in FIG. 4, the first 3$_1$ and second 3$_2$ amplification stages may define a single integrated component 11 that is secured to a small plate (or board) 10 and in four sub-parts of which are respectively defined the two first SOAs 8$_i$ and the two second SOAs 9$_i$.

The use of singly polarized SOAs 8$_1$ and 9$_1$ in the first amplification stage 3$_1$ may enable achieving a very large optical bandwidth with high gain, a high output power and a low noise figure. In the second amplification stage 3$_2$, one may use singly polarized SOAs 8$_2$ and 9$_2$ that enable achieving a very large optical bandwidth with high saturation output power and low gain, so that a large range of output power can be covered while managing the gain flatness.

The intermediate processing stage 4 is inserted between the first 3$_1$ and second 3$_2$ amplification stages. It is arranged for compensating chosen optical characteristics of the optical gain bandwidth of the first amplification stage 3$_1$ as a function of other driving currents I3$_i$ (or I3) and I4$_i$ (or I4).

For instance, and as illustrated, this intermediate processing stage 4 is secured to the small plate (or board) 10.

In the non-limiting example illustrated in FIG. 1, the intermediate processing stage 4 comprises a first variable optical attenuator 12$_1$, a first gain flattening filter 13$_1$, a second variable optical attenuator 12$_2$, and a second gain flattening filter 13$_2$.

The use of variable optical attenuators (or VOAs) 12$_i$ and gain flattening filters (or GFFs) 13$_i$ is intended for allowing compensation of optical characteristics of the optical gain bandwidth of the first amplification stage 3$_1$, and more precisely of the tilt and ripples.

The first variable optical attenuator (or VOA) 12$_1$ is arranged for compensating, on the first optical signal, a tilt of the optical gain bandwidth of the first polarized SOA 8$_1$ of the first amplification stage 3$_1$ as a function of a driving current I3$_1$. The tilt is an example of chosen optical characteristics of the optical gain bandwidth that can be compensated.

The first gain flattening filter 13$_1$ is arranged for compensating, on the first optical signal, ripples of the optical gain bandwidth of the first polarized SOA 8$_1$ of the first amplification stage 3$_1$ as a function of a driving current I4$_1$. Ripples are another example of chosen optical characteristics of the optical gain bandwidth that can be compensated.

The second variable optical attenuator (or VOA) 12$_2$ is arranged for compensating, on the second optical signal, a tilt of the optical gain bandwidth of the second polarized SOA 9$_1$ of the first amplification stage 3$_1$ as a function of a driving current I3$_2$.

The second gain flattening filter 13$_2$ is arranged for compensating, on the second optical signal, ripples of the optical gain bandwidth of the second polarized SOA 9$_1$ of the first amplification stage 3$_1$ as a function of a driving current I4$_2$.

In this example, each variable optical attenuator 12$_i$ and each gain flattening filter 13$_i$ are dedicated to the polarization of the modes of the optical signals they receive respectively. This may also allow minimizing polarization dependent gain between the two paths of the amplification device 1.

It is important to note that in the non-limiting example illustrated in FIG. 1, each variable optical attenuator 12$_i$ is located upward the associated gain flattening filter 13$_i$. But this is not mandatory. Indeed, each variable optical attenuator 12$_i$ could be located downward the associated gain flattening filter 13$_i$.

In the non-limiting examples illustrated in FIG. 3, the intermediate processing stage 4 comprises a single variable optical attenuator 12', a single gain flattening filter 13', a second combination element 14, and a second splitting element 15.

The second combination element 14 is arranged for combining the first and second amplified optical signals outputted by the first and second outputs of the first amplification stage 3$_1$ to produce an intermediate optical signal.

For instance, this second combination element 14 may be a polarization beam combiner, which may be realized by using a birefringent material that is capable of combining the first and second amplified optical signals it receives onto distant first and second inputs in order to deliver an intermediate optical signal. For instance, the birefringent material may be a crystal quartz.

The variable optical attenuator 12' is arranged for compensating, on this intermediate optical signal, the tilt of the optical gain bandwidth of the first stage 3$_1$ as a function of a driving current I3.

The gain flattening filter 13' is arranged for compensating, on the intermediate optical signal, ripples of the first amplification stage 3$_1$ as a function of a driving current I4.

So, in this example the variable optical attenuator 12' and the gain flattening filter 13' are not dependent from the polarization.

It is important to note that in the non-limiting examples illustrated in FIGS. 3 and 4, the variable optical attenuator 12' is located upward the gain flattening filter 13'. But this is not mandatory. Indeed, the variable optical attenuator 12' could be located downward the gain flattening filter 13'.

The second splitting element 15 is arranged for splitting the intermediate optical signal, processed by the variable optical attenuator 12' and gain flattening filter 13', in the first and second optical signals having respectively the first and second polarization modes.

For instance, this second splitting element 15 may be a polarization beam splitter which may be realized by using a birefringent material that is capable of physically splitting the intermediate optical signal in first and second optical signals in order to deliver them respectively onto distant first and second outputs. For instance, the birefringent material may be a crystal quartz.

The first combination element 5 is arranged for combining the first and second amplified optical signals (outputted by the first and second outputs of the second amplification stage $3_2$) to produce an output optical signal $S_{out}$. As illustrated, this output optical signal $S_{out}$ feeds a second optical fiber link 16 of the WDM transmission system, which is connected to an output of the amplification device 1.

For instance, the first combination element 5 may be a polarization beam combiner, which may be realized by using a birefringent material that is capable of combining the first and second amplified optical signals it receives onto distant first and second inputs in order to deliver an output optical signal $S_{out}$. For instance, the birefringent material may be a crystal quartz.

Also for instance, and as illustrated, the first splitting element 2 and the first combination element 5 (that performs a "reverse splitting") are secured to the small plate (or board) 10.

In the non-limiting examples illustrated in FIGS. 1 and 3, there is a free space between each output of the first splitting element 2 and the corresponding polarized SOA $8_1$ or $9_1$ of the first amplification stage $3_1$, but also between each output of each polarized SOA $8_1$ or $9_1$ of the first amplification stage $3_1$ and the corresponding input of the intermediate processing stage 4, and also between each output of the intermediate processing stage 4 and the input of the corresponding polarized SOA $8_2$ or $9_2$ of the second amplification stage $3_2$, and also between the output of each polarized SOA $8_2$ or $9_2$ of the second amplification stage $3_2$ and the corresponding input of the first combination element 5. The reason of that will appear below. When these free spaces are defined, the amplification device 1 preferably comprises further at least a first micro-lens $17_i$ located just before each first polarized SOA $8_i$, a second micro-lens $18_i$ located just after the first polarized SOA $8_i$, a third micro-lens $19_i$ located just before the second polarized SOA $9_i$, and a fourth micro-lens $20_i$ located just after the second polarized SOA $9_i$. These micro-lenses $17_i$-$20_i$ allow improving light coupling between elements.

For instance, and as illustrated, these micro-lenses $17_i$-$20_i$ are secured to the small plate (or board) 10.

In the non-limiting example illustrated in FIG. 4, all the SOAs $8_i$ and $9_i$ are defined into the same integrated component 11 and there is no free space between the output of the second combination element 14 and the input of the variable optical attenuator 12' and between the output of the gain flattening filter 13' and the input of the second splitting element 15. So, these two free spaces are replaced with two small optical fiber links 25 and 26. Two other micro-lenses 27 and 28 are also used to allow improving light coupling respectively between the output of the second combination element 14 and the input of the variable optical attenuator 12' and between the output of the gain flattening filter 13' and the input of the second splitting element 15. In a variant of the embodiment of FIG. 4, instead of using two small optical fiber links 25 and 26, it is possible to use prisms and mirrors for reflecting the optical signals towards the SOAs of the integrated component 11. The latter (11) may also comprise thermistor(s).

The control means 6 is arranged for producing all the driving currents $I1_i$, $I2_i$, $I3_i$ (ou I3) et $I4_i$ (ou I4) as a function of information representative of powers of at least the first and second optical signals at least before the first $8_i$ and second $9_i$ polarized SOAs and of a targeted power of the output optical signal $S_{out}$. So, it aims at controlling automatically the respective amplification levels of the first $8_i$ and second $9_i$ polarized SOAs of each amplification stage $3_i$ so that the output optical signal $S_{out}$ be approximately equal to the targeted power (i.e. equal to the latter with a predefined tolerance).

The control means 6 is preferably made of a combination of hardware and software modules, by means of a microcontroller or a central processing unit (CPU), for instance.

To ease practical implementation, the first $8_i$ and second $9_i$ polarized SOAs of each amplification stage $3_i$ are preferably arranged for amplifying optical signals having the first polarization mode (and preferably the TE mode). In this embodiment, the amplification device 1 must further comprise first 21 and second 22 transformation elements to allow a combination of first and second optical signals with different polarization modes by the first combination element 5, as illustrated in the non-limiting examples of FIGS. 1, 3 and 4.

The first transformation element 21 is arranged for transforming the second polarization mode of the second optical signal (provided by the second output of the first splitting element 2) in the first polarization mode. So, it is located before the second polarized SOA $9_1$ of the first amplification stage $3_1$. It should be understood that this transformation consists in a rotation from the second polarization mode to the first polarization mode.

The second transformation element 22 is arranged for transforming the first polarization mode of the first optical signal (provided by the output of the first polarized SOA $8_2$ of the second amplification stage $3_2$) in the second polarization mode. So, it is located after the first polarized SOA $8_2$. It should be understood that this transformation consists in a rotation from the first polarization mode to the second polarization mode.

Such an embodiment allows the first combination element 5 to combine the first optical signal (amplified and having the second polarization mode) with the second optical signal (amplified and having the first polarization mode) to produce the output optical signal $S_{out}$.

For instance, the first transformation element 21 and/or the second transformation element 22 comprise(s) a waveplate arranged for inducing the above mentioned polarization mode rotations. These waveplates may be used when the above mentioned free spaces are defined.

In the non-limiting examples illustrated in FIGS. 3 and 4, the intermediate processing stage 4 must further comprise third 23 and fourth 24 transformation elements. The third transformation element 23 is arranged for transforming the first polarization mode of the first optical signal in the second polarization mode before the second combination element 14. The fourth transformation element 24 is arranged for transforming the second polarization mode of the second optical signal in the first polarization mode after the second output of the second splitting element 15.

For instance, the third transformation element 23 and/or the fourth transformation element 24 comprise(s) a waveplate arranged for inducing the above mentioned polarization mode rotations. These waveplates may be used when free spaces are defined.

The non-limiting embodiments described above, with reference to FIGS. 1, 3 and 4, allow defining two equivalent optical paths, respectively for the first and second optical signals. This allows the control means 6 to automatically equalize the powers outputted respectively by these two optical paths and feeding respectively the first and second inputs of the first combination element 5.

In order the control means 6 be informed of the respective powers of the first and second optical signals before the first $8_i$ and second $9_i$ SOAs of each amplification stage $3_i$, the amplification device 1 may comprise at least first $29_i$ and second $30_i$ extracting elements and first $33_i$ and second $34_i$ photodiodes.

Each first extracting element $29_i$ is arranged for taking a first predefined percentage of the power of the first optical signal before a corresponding first polarized SOA $8_i$. Each first photodiode $33_i$ is arranged for producing a first information $PI1_i$ representative of the power taken from the first optical signal before the corresponding first polarized SOA $8_i$ for the control means 6. Each second extracting element $30_i$ is arranged for taking a second predefined percentage of the power of the second optical signal before the corresponding second polarized SOA $9_i$. Each second photodiode $34_i$ is arranged for producing a second information $PI2_i$ representative of the power taken from the second optical signal before the corresponding second polarized SOA $9_i$ for the control means 6.

For instance, the first and second predefined percentages may be equal to 1%. But other values may be used.

Also for instance, the first $29_i$ and second $30_i$ extracting elements may each comprise a tap coupler arranged for reflecting the first or second predefined power percentage of the first or second optical signal, and of transmitting the complementary power percentage of the first or second optical signal. In the case where the first or second predefined percentage is equal to 1%, the complementary power percentage is equal to 99%.

Also for instance, the first $29_i$ and second $30_i$ extracting elements may be beamsplitters, such as semi-reflective plates or partially reflective mirrors. These beamsplitters may be used when the above mentioned free spaces are defined.

Also for instance, and as illustrated, the first $29_i$ and second $30_i$ extracting elements are secured to the small plate (or board) 10. The first $33_i$ and second $34_i$ photodiodes may be secured to the same plate or to a subsidiary plate positioned below the first one.

Also for instance, the first $33_i$ and second $34_i$ photodiodes may exhibit a low bandwidth.

To improve the power equalization on the two optical paths, the control means 6 may be advantageously arranged for producing all the driving currents $I1_i$ to $I4_i$ as a function also of other information representative of powers of the first and second optical signals after the first $8_i$ and second $9_i$ polarized SOAs of ech amplification stage $3_i$.

In order the control means 6 be informed of the respective powers of the first and second optical signals after the first $8_i$ and second $9_i$ polarized SOAs of each amplification stage $3_i$, the amplification device 1 may comprise third $31_i$ and fourth $32_i$ extracting elements and third $35_i$ and fourth $36_i$ photodiodes.

Each third extracting element $31_i$ is arranged for taking a third predefined percentage of the power of the first optical signal after the corresponding first polarized SOA $8_i$. Each third photodiode $35_i$ is arranged for producing a third information $PI3_i$ representative of the power taken from the first optical signal after the corresponding first polarized SOA $8_i$ for the control means 6. Each fourth extracting element $32_i$ is arranged for taking a fourth predefined percentage of the power of the second optical signal after the corresponding second polarized SOA $9_i$. Each fourth photodiode $36_i$ is arranged for producing a fourth information $PI4_i$ representative of the power taken from the second optical signal after the corresponding second polarized SOA $9_i$ for the control means 6.

For instance, the third and fourth predefined percentages may be equal to 1%. But other values may be used.

Also for instance, the third $31_i$ and fourth $32_i$ extracting elements may each comprise a tap coupler arranged for reflecting the third or fourth predefined power percentage of the first or second amplified optical signal, and of transmitting the complementary power percentage of the first or second amplified optical signal. In the case where the first or second predefined percentage is equal to 1%, the complementary power percentage is equal to 99%.

Also for instance, the third $31_i$ and fourth $32_i$ extracting elements may be beamsplitters, such as semi-reflective plates or partially reflective mirrors. These beamsplitters may be used when the above mentioned free spaces are defined.

Also for instance, and as illustrated, the third $31_i$ and fourth $32_i$ extracting elements are secured to the small plate (or board) 10. The third $35_i$ and fourth $36_i$ photodiodes may be secured to the same plate or to a subsidiary plate positioned below the first one.

Also for instance, the third $35_i$ and fourth $36_i$ photodiodes may exhibit a low bandwidth.

The last embodiment allows the control means 6 to precisely balance output powers from the first $8_i$ and second $9_i$ SOAs of each amplification stage $3_i$ according to the targeted power of the output optical signal $S_{out}$ of the amplification device 1. Once this targeted power is set in the control means 6 through the control plane or a manual setting at startup, each optical path should transmit half of this targeted power. So, the control means 6 adjusts all the driving currents $I1_i$ to $I4_i$ accordingly. To this effect, the control means 6 may, for instance, determine the driving currents $I1_i$ to $I4_i$ from stored data establishing a correspondence between information representative of powers and driving currents.

After having received the power information $PI1_i$-$PI4_i$ of the two optical paths, the control means 6 finely tunes each driving current $I1_i$ to $I4_i$ to reach the targeted power, while taking into account a tolerance on the targeted power.

Although this does not appear in the Figures, the amplification device 1 may further comprise a polarization dependent optical isolator before each input and/or after each output of each amplification stage $3_i$.

Thanks to the invention the capacity of a WDM transmission system may be approximately tripled and a management of the gain flatness can be performed. Moreover, the invention also allows to compensate lumped losses in optical networks by means of simple management rules.

It should be appreciated by those skilled in the art that any block diagram herein represent conceptual views of illustrative circuitry embodying the principles of the invention.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. An amplification device comprising:
   a) a first splitting element arranged for splitting an input optical signal into first and second optical signals having respectively first and second polarization modes;
   b) first and second amplification stages each comprising first and second polarized semiconductor optical amplifiers arranged for amplifying respectively said first and second optical signals as a function of driving currents;
   c) an intermediate processing stage inserted between said first and second amplification stages;
   d) a first combination element arranged for combining said first and second amplified optical signals outputted by said second amplification stage to produce an output optical signal; and
   e) a processor configured to execute non-transitory machine-readable instructions such that, when executed, cause the process to produce said driving currents as a function of information representative of powers of said first and second optical signals at least before said first and second polarized semiconductor optical amplifiers of each amplification stage and of a targeted power of said output optical signal,
   wherein said intermediate processing stage includes,
      a first variable optical attenuator arranged for compensating, on said first optical signal, a tilt of said optical gain bandwidth of said first polarized semiconductor optical amplifier of said first amplification stage,
      a first gain flattening filter arranged for compensating, on said first optical signal, ripples of said optical gain bandwidth of said first polarized semiconductor optical amplifier of said first amplification stage,
      a second variable optical attenuator arranged for compensating, on said second optical signal, a tilt of said optical gain bandwidth of said second polarized semiconductor optical amplifier of said first amplification stage, and
      a second gain flattening filter arranged for compensating, on said second optical signal, ripples of said optical gain bandwidth of said second polarized semiconductor optical amplifier of said first amplification stage.

2. The amplification device according to claim 1, wherein said first and second polarized semiconductor optical amplifiers of each amplification stage are arranged for amplifying optical signals having said first polarization mode, and wherein the amplification device further comprises:
   a first transformation element arranged for transforming said second polarization mode of said second optical signal in said first polarization mode before said second polarized semiconductor optical amplifier of said first amplification stage; and
   a second transformation element arranged for transforming said first polarization mode of said first optical signal in said second polarization mode after said first polarized semiconductor optical amplifier of said second amplification stage, so that said first combination element combines said first optical signal amplified, having said second polarization mode and outputted by said second amplification stage with said second optical signal amplified, having said first polarization mode and outputted by said second amplification stage to produce said output optical signal.

3. The amplification device according to claim 2, wherein said first transformation element and/or said second transformation element comprise(s) a waveplate.

4. The amplification device according to claim 1, further comprising:
   first and second micro-lenses located respectively just before and just after said first polarized semiconductor optical amplifier of each amplification stage, and third and fourth micro-lenses located respectively just before and just after said second polarized semiconductor optical amplifier of each amplification stage.

5. The amplification device according to claim 1, just before each amplification stage, further comprising:
   a) a first extracting element arranged for taking a first predefined percentage of the power of said first optical signal before said first polarized semiconductor optical amplifier;
   b) a first photodiode arranged for producing a first information representative of the power taken from said first optical signal before said first polarized semiconductor optical amplifier for said processor;
   c) a second extracting element arranged for taking a second predefined percentage of the power of said second optical signal before said second polarized semiconductor optical amplifier; and
   d) a second photodiode arranged for producing a second information representative of the power taken from said second optical signal before said second polarized semiconductor optical amplifier for said processor.

6. The amplification device according to claim 1, wherein said processor is arranged for producing said driving currents as a function of information representative of powers of said first and second optical signals before and after said first and second polarized semiconductor optical amplifiers of each amplification stage and of said targeted power of said output optical signal.

7. The amplification device according to claim 6, after each amplification stage, further comprising:
   a) a third extracting element arranged for taking a third predefined percentage of the power of said first optical signal after said first polarized semiconductor optical amplifier;
   b) a third photodiode arranged for producing a third information representative of the power taken from said first optical signal after said first polarized semiconductor optical amplifier for said processor;
   c) a fourth extracting element arranged for taking a fourth predefined percentage of the power of said second optical signal after said second polarized semiconductor optical amplifier; and
   d) a fourth photodiode arranged for producing a fourth information representative of the power taken from said second optical signal after said second polarized semiconductor optical amplifier for said processor.

8. The amplification device according to claim 1, wherein said first polarization mode is a transverse electric mode and said second polarization mode is a transverse magnetic mode.

9. The amplification device according to claim 1, wherein each splitting element and/or each combination element comprise(s) a birefringent material.

10. The amplification device according to claim 1, wherein said processor is arranged for determining said driving currents from stored data establishing a correspondence between information representative of powers and driving currents.

11. The amplification device according to claim 1, further comprising:
   a polarization dependent optical isolator before each input and/or after each output of each amplification stage.

12. An amplification device comprising:
   a) a first splitting element arranged for splitting an input optical signal into first and second optical signals having respectively first and second polarization modes;

b) first and second amplification stages each comprising first and second polarized semiconductor optical amplifiers arranged for amplifying respectively said first and second optical signals as a function of driving currents;
c) an intermediate processing stage inserted between said first and second amplification stages;
d) a first combination element arranged for combining said first and second amplified optical signals outputted by said second amplification stage to produce an output optical signal; and
e) a processor configured to execute non-transitory machine-readable instructions such that, when executed, cause the process to produce said driving currents as a function information representative of powers of said first and second optical signals at least before said first and second polarized semiconductor optical amplifiers of each amplification stage and of a targeted power of said output optical signal,
wherein said intermediate processing stage comprises,
a) a second combination element arranged for combining said first and second amplified optical signals outputted by said first amplification stage to produce an intermediate optical signal,
b) a variable optical attenuator arranged for compensating, on said intermediate optical signal, a tilt of said optical gain bandwidth of said first stage,
c) a gain flattening filter arranged for compensating, on said intermediate optical signal, ripples of said first amplification stage, and
d) a second splitting element arranged for splitting said intermediate optical signal, processed by said variable optical attenuator and gain flattening filter, in said first and second optical signals having respectively said first and second polarization modes.

13. The amplification device according to claim 12, wherein said intermediate processing stage further comprises a third transformation element arranged for transforming said first polarization mode of said first optical signal in said second polarization mode before said second combination element, and a fourth transformation element arranged for transforming said second polarization mode of said second optical signal in said first polarization mode after said second splitting element.

14. The amplification device according to claim 13, wherein said third transformation element and/or said fourth transformation element comprise(s) a waveplate.

* * * * *